(12) United States Patent
Lai et al.

(10) Patent No.: US 8,330,513 B2
(45) Date of Patent: Dec. 11, 2012

(54) VOLTAGE HOLD CIRCUIT

(75) Inventors: Yu-Sheng Lai, Hsinchu (TW); Feng-Chia Chang, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 164 days.

(21) Appl. No.: 13/050,969

(22) Filed: Mar. 18, 2011

(65) Prior Publication Data
US 2012/0169379 A1    Jul. 5, 2012

(30) Foreign Application Priority Data
Dec. 31, 2010  (TW) ................. 99147193 A

(51) Int. Cl.
*H03L 7/06* (2006.01)
(52) U.S. Cl. ........................ 327/158; 327/161
(58) Field of Classification Search .......... 327/158, 327/161
See application file for complete search history.

(56) References Cited

U.S. PATENT DOCUMENTS
8,198,930 B2 *   6/2012   Zerbe et al. ............ 327/261

* cited by examiner

*Primary Examiner* — Kenneth B. Wells
(74) *Attorney, Agent, or Firm* — Winston Hsu; Scott Margo

(57) ABSTRACT

A voltage hold circuit includes four switches, an operational amplifier and a capacitor. By turning the switches on and off, the operational amplifier functions as a unity-gain buffer. In the normal operation mode, the positive input end of the operational amplifier is coupled to a node, and the output end of the operational amplifier is coupled to the capacitor. Thus the voltage of the capacitor is equal to the voltage of the node. In the power off mode, the positive input end of the operational amplifier is coupled d to the capacitor, and the output end of the operational amplifier is coupled to the node. Thus the voltage of the node is equal to the voltage of the capacitor. Therefore, the voltage hold circuit is able to hold the voltage of the node in the power down state.

14 Claims, 6 Drawing Sheets

VOLTAGE HOLD CIRCUIT

BACKGROUND OF THE INVENTION

1. Field of the Invention

The present invention is related to a voltage hold circuit, and more particularly, to a voltage hold circuit of a delay-locked loop circuit.

2. Description of the Prior Art

Please refer to FIG. 1. FIG. 1 is a block diagram illustrating a prior art delay-locked loop (DLL) circuit 10. The DLL circuit 10 is configured to generate output signals having the same cycle length as the input clock signals, but delayed by a cycle. The DLL circuit 10 includes a phase frequency detector 11, a charge pump circuit 12, a capacitor 13, a voltage controlled delay line (VCDL) 14 and a dummy delay circuit 15. The phase frequency detector 11 is configured to receive input clock signals SI and feedback signals FB, thereby generating UP signals SU and DOWN signals SD according to phase difference and frequency difference between the two detected signals. The charge pump circuit 12 is configured to receive the UP signals SU and the DOWN signals SD, thereby changing the generated current signals according to the logic state of the UP signals SU and the DOWN signals SD. The capacitor 13 is configured to receive the current signals from the charge pump circuit 12, thereby generating a DC voltage VA by low pass filtering the current signals. The voltage controlled delay line 14 is configured to receive the input clock signals SI and the DC voltage VA, thereby determining the required delay time of the input clock signals SI according to the DC voltage VA. Feedback signal FB is generated as the output signal SO of the VCDL 14 passes through the dummy delay circuit 14.

For the DLL circuit with a feedback loop, a node voltage VA (such as 736 mV) raises/decreases to voltage VDD/VSS due to partial power shutdown and leakage current of components in the feedback loop. After that, it takes a lot of time for the node voltage VA to be reestablished to the original voltage (736 mV) so as to recover the feedback loop. However, a common double data rate dynamic random access memory (DDR DRAM) chip regains normal operation about 2 to 10 time clock cycles after leaving partial power saving mode. Therefore, it is important to maintain the level of the node voltage VA. Maintaining the feedback loop in the power saving mode consumes a lot of power. Maintain the node voltage VA using analog-to-digital converter (ADC) or digital-to-analog converter (DAC) occupies large chip space, while using large capacitor results in large loading effect. Besides, leakage current of switch components is an issue which needs to be taken into consideration.

SUMMARY OF THE INVENTION

It is one of the objectives of the claimed invention to provide a voltage hold circuit.

According to one embodiment, a voltage hold circuit is provided. The voltage hold circuit includes an operational amplifier, a first switch, a second switch, a third switch, a fourth switch and a capacitor. The operational amplifier includes a positive input end, a negative input end, and an output end coupled to the negative input end. The first switch includes a first end, a second end coupled to the positive input end of the operational amplifier, and a control end for receiving a first control signal. The second switch includes a first end coupled to the first end of the first switch, a second end coupled to the negative input end of the operational amplifier, and a control end for receiving a second control signal. The third switch includes a first end coupled to the output end of the operational amplifier, a second end, and a control end for receiving the first control signal. The fourth switch includes a first end coupled to the positive input end of the operational amplifier, a second end coupled to the second end of the third switch, and a control end for receiving the second control signal. The capacitor includes a first end coupled to the second end of the fourth switch, and a second end coupled to a ground end.

According to one embodiment, a voltage hold circuit is provided. The voltage hold circuit includes an operational amplifier, a capacitor and a switch module. The operational amplifier includes a positive input end, a negative input end, and an output end coupled to the negative input end. The switch module is for coupling the positive input end of the operational amplifier to a node, and the output end of the operational amplifier to the capacitor when operating in a first phase, and for coupling the positive input end of the operational amplifier to the capacitor, and the output end of the operational amplifier to the node when operating in a second phase.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
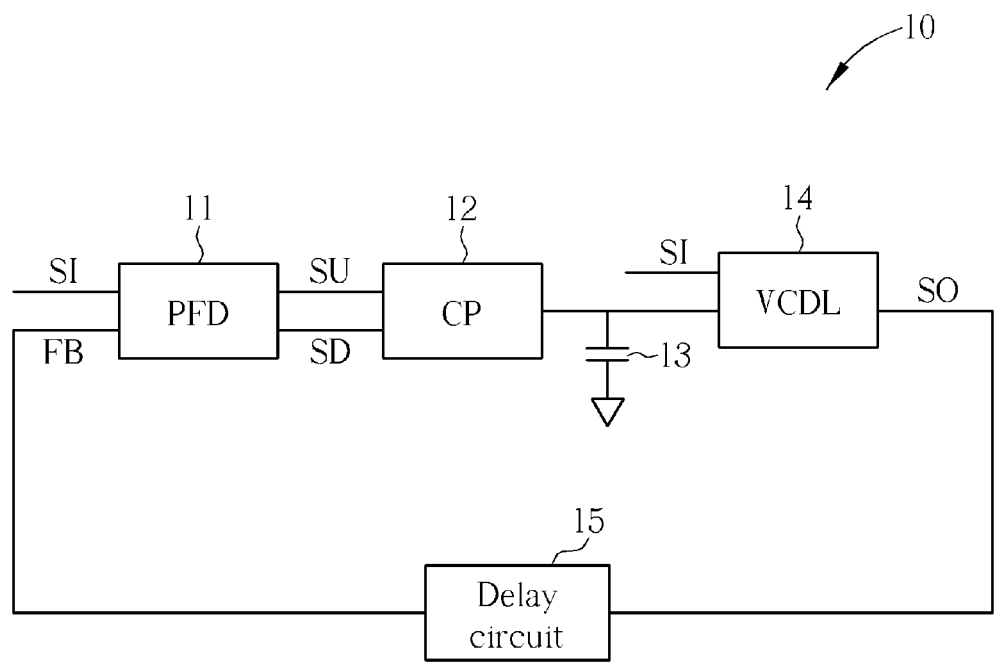
FIG. 1 is a block diagram illustrating a prior art DLL circuit.
Figure 2:
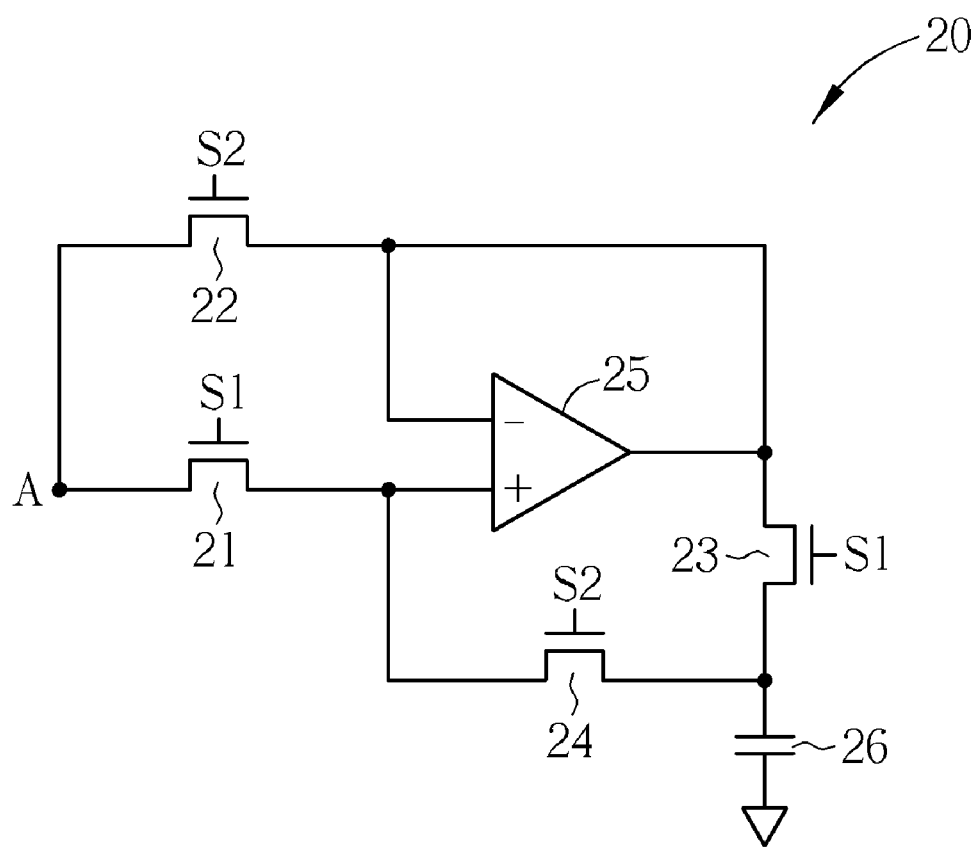
FIG. 2 is a diagram illustrating a voltage hold circuit according to the present invention.

Please refer to FIG. 2. FIG. 2 is a diagram illustrating a voltage hold circuit 20 according to the present invention. The voltage hold circuit 20 includes a first switch 21, a second switch 22, a third switch 23, a fourth switch 24, an operational amplifier 25, and a capacitor 26. An output end of the operational amplifier 25 is coupled to a negative input end of the operational amplifier 25. The first switch 21 is coupled between a node A and a positive input end of the operational amplifier 25, the second switch 22 is coupled between the node A and the negative input end of the operational amplifier 25, the third switch 23 is coupled between an output end of the operational amplifier 25 and the capacitor 26, and the fourth switch 24 is coupled between the positive input end of the operational amplifier 25 and the capacitor 26. In this embodiment, the first switch 21 and the third switch 23 are controlled by the first control signal S1, while the second switch 22 and the fourth switch 24 are controlled by the second control signal S2. When the first switch 21 and the third switch 23 are turned on, the second switch 22 and the fourth switch 24 are turned off; when the first switch 21 and the third switch 23 are turned off, the second switch 22 and the fourth switch 24 are turned on. The switches 21 to 24 may be implemented by NMOS transistors, PMOS transistors, CMOS transistors, or transmission gates, with different corresponding control signals. Therefore, by switching the switches 21 to 24, the voltage hold circuit 20 may maintain the voltage level of the node A when the power is shut down.

Figure 3:
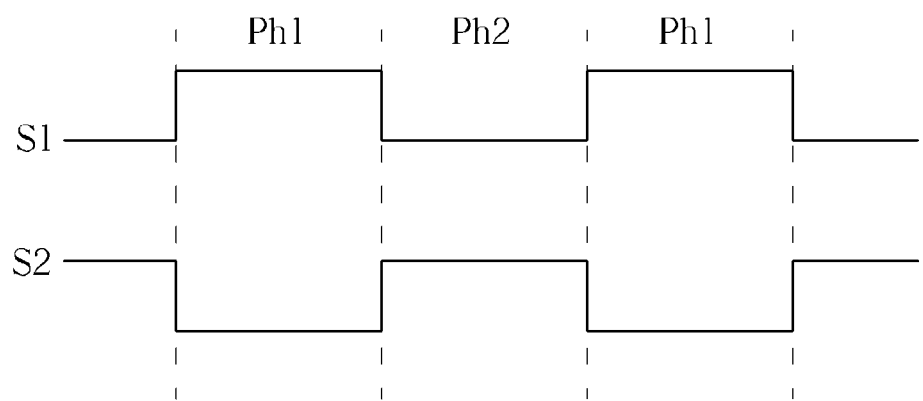
FIG. 3 is a wave diagram of the voltage hold circuit according to the present invention.

Please refer to FIG. 3. FIG. 3 is a wave diagram illustrating the control signals of the voltage hold circuit 20 according to the present invention. The first control signal S1 and the second control signal S2 are complementary signals. When the first control signal S1 is at high level, the second control signal S2 is at low level. When the first control signal S1 is at low level, the second control signal S2 is at high level. According to the first control signal S1 and the second control signal S2, the voltage hold circuit 20 operates in a first phase Ph1 and a second phase Ph2. During the first phase Ph1, the first switch 21 and the third switch 23 are turned on, and the second switch 22 and the fourth switch 24 are turned off. During the second phase Ph2, the first switch 21 and the third switch 23 are turned off, and the second switch 22 and the fourth switch 24 are turned on. During the first phase Ph1, the voltage hold circuit 20 operates in a normal operation mode, and the voltage of the node A is stored in the capacitor 26. During the second phase Ph2, the voltage hold circuit 20 operates in the power off mode, and the voltage level of the node A is maintained by the capacitor 26.

Figure 4:
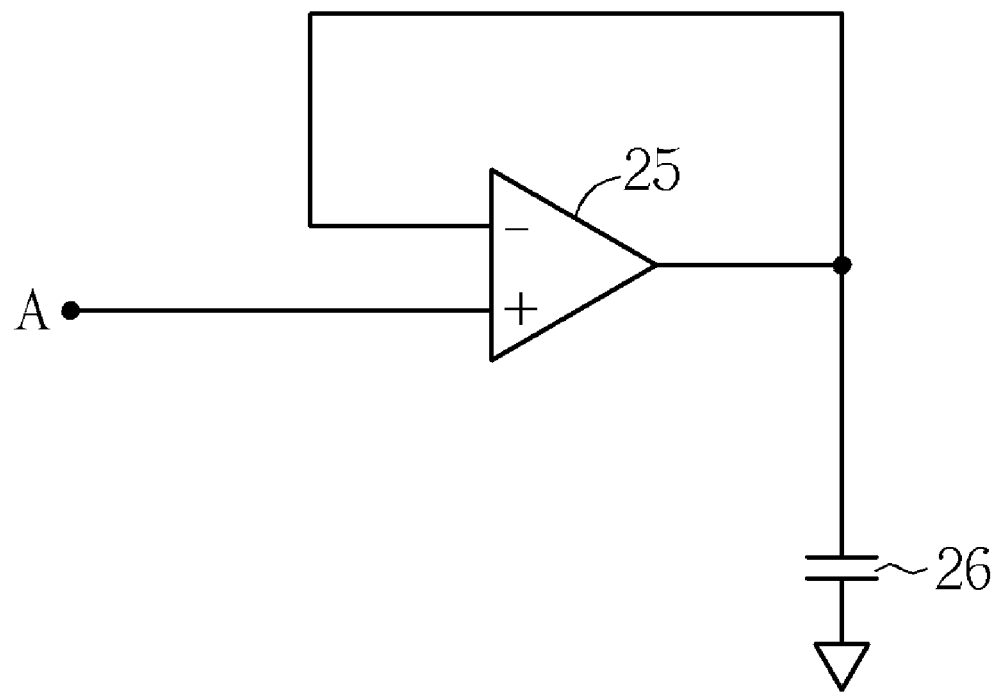
FIG. 4 is a diagram illustrating an equivalent circuit of the voltage hold circuit according to the present invention when operating in a first phase.

Please refer to FIG. 4. FIG. 4 is a diagram illustrating an equivalent circuit of the present voltage hold circuit 20 when operating in the first phase Ph1. During the first phase Ph1, the first switch 21 and the third switch 23 are turned on, and the second switch 22 and the fourth switch 24 are turned off. Thus, the node A is coupled to the positive input end of the operational amplifier 25, and the output end of the operational amplifier 25 is coupled to the capacitor 26. Hence the operational amplifier 25 functions as a unity-gain buffer. The voltage of the node A is outputted to the capacitor 26 via the operational amplifier 25. That is, the voltage of the node A charges the capacitor 26, and the voltage of the capacitor 26 then becomes equal to the voltage of the node A. In the normal operation mode, the voltage hold circuit 20 enters the first phase Ph1. Therefore, the voltage level of the node A may be stored in the capacitor 26.

Figure 5:
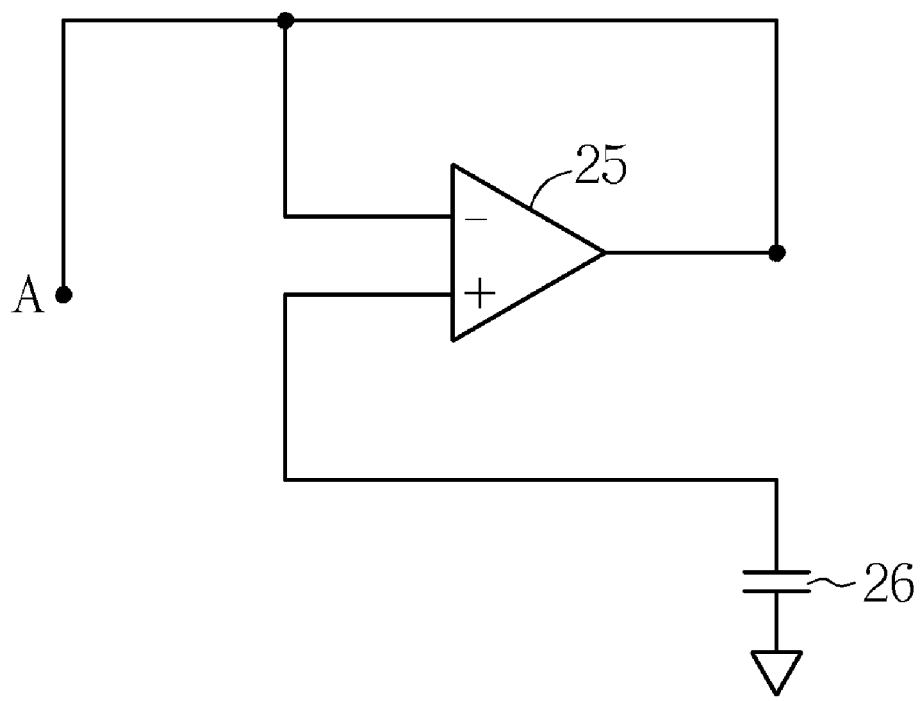
FIG. 5 is a diagram illustrating an equivalent circuit of the voltage hold circuit according to the present invention when operating in a second phase.

Please refer to FIG. 5. FIG. 5 is a diagram illustrating an equivalent circuit of the voltage hold circuit 20 when operating in the second phase Ph2. In the second phase Ph2, the first switch 21 and the third switch 23 are turned off, and the second switch 22 and the fourth switch 24 are turned on. Thus, the capacitor 26 is coupled to the positive input end of the operational amplifier 25, and the output end of the operational amplifier 25 is coupled to the node A. The operational amplifier 25 functions as a unity-gain buffer. The voltage of the capacitor 26 is outputted to the node A via the operational amplifier 25, and the voltage of the node A then becomes equal to the voltage of the capacitor 26. In the power-off mode, the voltage hold circuit 20 enters the second phase Ph2. Therefore, the voltage level of the node A may be maintained by the capacitor 26.

Figure 6:
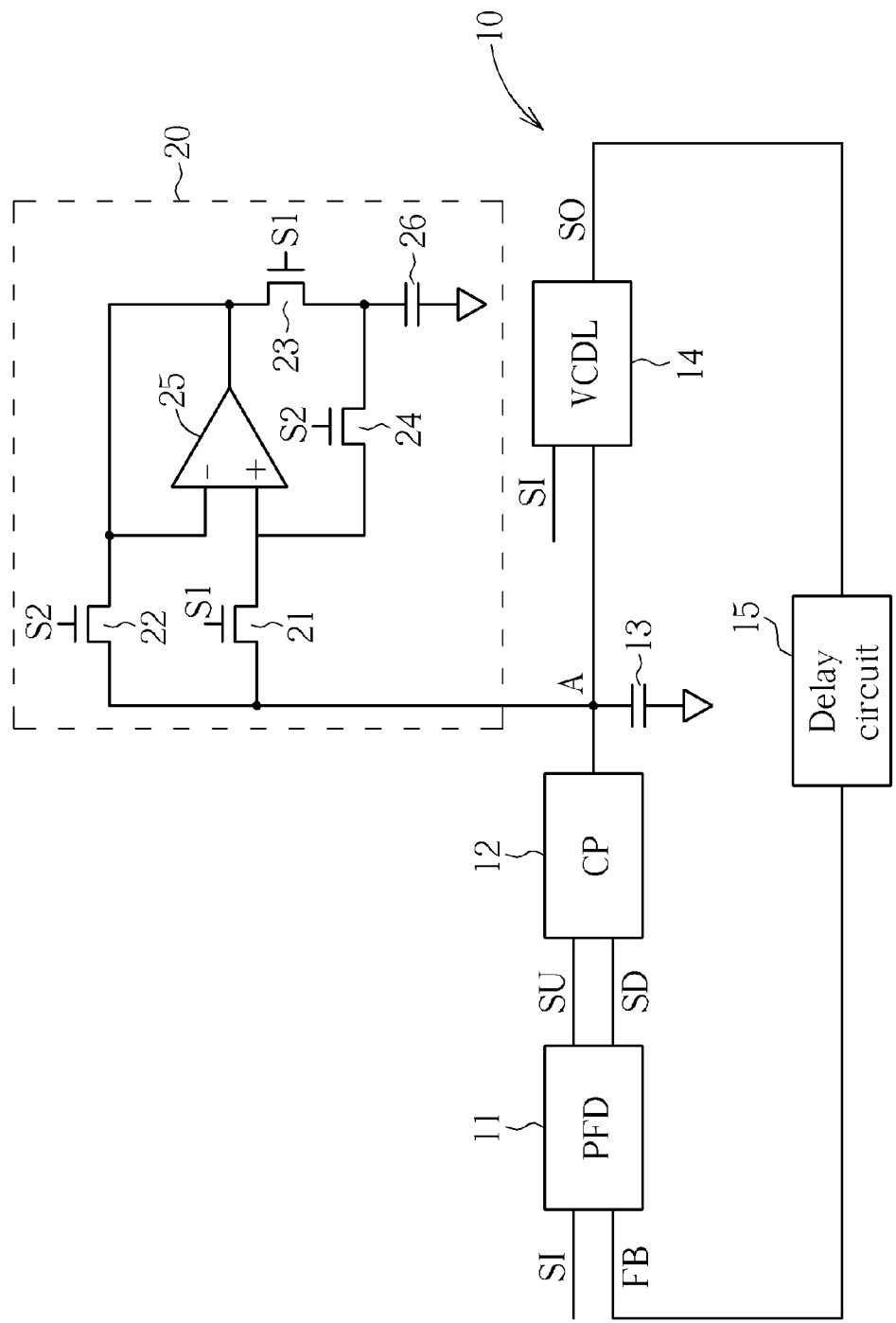
FIG. 6 is a diagram illustrating the present voltage hold circuit coupled to a DLL circuit.

Please refer to FIG. 6. FIG. 6 is a diagram illustrating the voltage hold circuit 20 coupled to the DLL circuit 10. The DLL circuit 10 is configured generate output signals having the same cycle length as the input clock signals, but delayed by a certain phase. The DLL circuit 10 includes a phase frequency detector 11, a charge pump circuit 12, a capacitor 13, a VCDL 14 and a dummy delay circuit 15. The voltage hold circuit 20 is coupled to the node A. When the DLL circuit 10 operates in the normal operation mode, the first switch 21 and the third switch 23 of the voltage hold circuit 20 are turned on, and the second switch 22 and the fourth switch 24 are turned off. Thus, the voltage hold circuit 20 may receive the current signal from the charge pump circuit 20, and generate DC voltage VA by low-pass filtering the current signal by the capacitor 16. At the time, the voltage of the capacitor 26 is equal to the DC voltage VA. When the power of the DLL circuit 10 is shut down, the first switch 21 and the third switch 23 of the voltage hold circuit 20 are turned off, and the second switch 22 and the fourth switch 24 are turned on. Therefore, the voltage level of the node A may be maintained by the capacitor 26.

In summary, the voltage hold circuit of the present invention includes four switches, an operational amplifier and a capacitor. According to the switching of the switches, the operational amplifier functions as a unity-gain buffer. In the normal operation mode, the positive input end of the operational amplifier is coupled to a node, and the output end of the operational amplifier is coupled to the capacitor. Therefore, the voltage of the capacitor is equal to the voltage of the node. In the power-off mode, the positive input end of the operational amplifier is coupled to the capacitor, and output end of the operational amplifier is coupled to the node. Therefore, the voltage of the node is equal to the voltage of the capacitor. Since the capacitor and the operational amplifier of the voltage hold circuit both have small leakage current, the voltage hold circuit may maintain the voltage of the node when powered-off.

Those skilled in the art will readily observe that numerous modifications and alterations of the device and method may be made while retaining the teachings of the invention.

What is claimed is:
1. A voltage hold circuit, comprising:
an operational amplifier, including:
   a positive input end;
   a negative input end; and
   an output end coupled to the negative input end;
a first switch, including:
   a first end;
   a second end coupled to the positive input end of the operational amplifier; and
   a control end for receiving a first control signal;
a second switch, including:
   a first end coupled to the first end of the first switch;
   a second end coupled to the negative input end of the operational amplifier; and
   a control end for receiving a second control signal;
a third switch, including:
   a first end coupled to the output end of the operational amplifier;
   a second end; and
   a control end for receiving the first control signal;
a fourth switch, including:
   a first end coupled to the positive input end of the operational amplifier;
   a second end coupled to the second end of the third switch; and
   a control end for receiving the second control signal; and
a capacitor, including:
   a first end coupled to the second end of the fourth switch; and
   a second end coupled to a ground end.
2. The voltage hold circuit of claim 1, wherein the second switch and the fourth switch are turned off when the first switch and the third switch are turned on, and the second switch and the fourth switch are turned on when the first switch and the third switch are turned off.

3. The voltage hold circuit of claim 1, wherein the voltage hold circuit operates in a first phase or a second phase according to the first control signal and the second control signal.

4. The voltage hold circuit of claim 3, wherein the positive input end of the operational amplifier is coupled to a node and the output end of the operational amplifier is coupled to the capacitor when the voltage hold circuit operates in the first phase.

5. The voltage hold circuit of claim 4, wherein when the voltage hold circuit operates in the second phase, the positive input end of the operational amplifier is coupled to the capacitor, and the output end of the operational amplifier is coupled to the node.

6. The voltage hold circuit of claim 1, wherein the voltage hold circuit is coupled to a delay-locked loop (DLL) circuit.

7. The voltage hold circuit of claim 6, wherein the DLL circuit comprises:
  a phase frequency detector;
  a charge pump circuit coupled to the phase frequency detector;
  a capacitor coupled to the charge pump;
  a voltage controlled delay line coupled to the charge pump; and
  a dummy delay circuit coupled to the voltage controlled delay line and the phase frequency detector.

8. The voltage hold circuit of claim 7, further coupled to the charge pump.

9. A voltage hold circuit, comprising:
  an operational amplifier, including:
    a positive input end;
    a negative input end; and
    an output end coupled to the negative input end;
  a capacitor; and
  a switch module configured to couple the positive input end of the operational amplifier to a node and couple the output end of the operational amplifier to the capacitor when operating in a first phase, and configured to couple the positive input end of the operational amplifier to the capacitor and couple the output end of the operational amplifier to the node when operating in a second phase.

10. The voltage hold circuit of claim 9, wherein the switch module comprises:
  a first switch, including:
    a first end coupled to the node;
    a second end coupled to the positive input end of the operational amplifier; and
    a control end for receiving a first control signal;
  a second switch, including:
    a first end coupled to the node;
    a second end coupled to the negative input end of the operational amplifier; and
    a control end for receiving a second control signal;
  a third switch, including:
    a first end coupled to the output end of the operational amplifier;
    a second end; and
    a control end for receiving the first control signal; and
  a fourth switch, including:
    a first end coupled to the positive input end of the operational amplifier;
    a second end coupled to the second end of the third switch; and
    a control end for receiving the second control signal.

11. The voltage hold circuit of claim 10, wherein the second switch and the fourth switch are turned off when the first switch and the third switch are turned on, and the second switch and the fourth switch are turned on when the first switch and the third switch are turned off.

12. The voltage hold circuit of claim 9, wherein the voltage hold circuit is coupled to a DLL circuit.

13. The voltage hold circuit of claim 12, wherein the DLL circuit comprises:
  a phase frequency detector;
  a charge pump circuit coupled to the phase frequency detector;
  a capacitor coupled to the charge pump;
  a voltage controlled delay line coupled to the charge pump; and
  a dummy delay circuit coupled to the voltage controlled delay line and the phase frequency detector.

14. The voltage hold circuit of claim 13, wherein the node is the output end of the charge pump.

* * * * *